US011800707B2

(12) United States Patent
Peng et al.

(10) Patent No.: US 11,800,707 B2
(45) Date of Patent: Oct. 24, 2023

(54) THREE-DIMENSIONAL MEMORY DEVICE WITH REDUCED LOCAL STRESS

(71) Applicant: YANGTZE MEMORY TECHNOLOGIES CO., LTD., Wuhan (CN)

(72) Inventors: Shuangshuang Peng, Wuhan (CN); Jingjing Geng, Wuhan (CN); Jiajia Wu, Wuhan (CN); Tuo Li, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 4 days.

(21) Appl. No.: 16/881,268

(22) Filed: May 22, 2020

(65) Prior Publication Data

US 2021/0305274 A1    Sep. 30, 2021

Related U.S. Application Data

(63) Continuation of application No. PCT/CN2020/082533, filed on Mar. 31, 2020.

(51) Int. Cl.
*H10B 43/27*    (2023.01)
*H10B 43/35*    (2023.01)

(52) U.S. Cl.
CPC ............. *H10B 43/27* (2023.02); *H10B 43/35* (2023.02)

(58) Field of Classification Search
CPC ........... H01L 27/11582; H01L 27/1157; H10B 69/00; H10B 53/00; H10B 53/10;
(Continued)

(56) References Cited

U.S. PATENT DOCUMENTS

| 9,397,109 B1* | 7/2016 | Fukuzumi | ......... H01L 27/11582 |
| 2012/0120728 A1* | 5/2012 | Kim | ..................... H01L 29/7926 |
| | | | 365/185.18 |

(Continued)

FOREIGN PATENT DOCUMENTS

| CN | 1184666 C | 1/2005 |
| CN | 107481927 A | 12/2017 |

(Continued)

OTHER PUBLICATIONS

International Search Report issued in corresponding International Application No. PCT/CN2020/082533, dated Dec. 28, 2020, 5 pages.

*Primary Examiner* — Didarul A Mazumder
*Assistant Examiner* — Gustavo G Ramallo
(74) *Attorney, Agent, or Firm* — BAYES PLLC

(57) ABSTRACT

Embodiments of 3D memory devices and methods for forming the same are disclosed. In an example, a 3D memory device includes a substrate, a memory stack including interleaved conductive layers and dielectric layers above the substrate, and a channel structure extending vertically through the memory stack. The channel structure includes a high dielectric constant (high-k) dielectric layer disposed continuously along a sidewall of the channel structure, a memory film over the high-k dielectric layer along the sidewall of the channel structure, and a semiconductor channel over the memory film along the sidewall of the channel structure.

20 Claims, 15 Drawing Sheets

(58) Field of Classification Search
CPC ........ H10B 53/20; H10B 53/30; H10B 53/40;
H10B 53/50; H10B 41/00; H10B 41/10;
H10B 41/20; H10B 41/23; H10B 41/27;
H10B 41/30; H10B 41/35; H10B
41/40–44; H10B 41/46–50; H10B 41/60;
H10B 41/70; H10B 43/00; H10B 43/10;
H10B 43/20; H10B 43/23; H10B 43/27;
H10B 43/30; H10B 43/35; H10B 43/40;
H10B 43/50; H10B 51/00; H10B 51/10;
H10B 51/20; H10B 51/30; H10B 51/40;
H10B 51/50
See application file for complete search history.

(56) References Cited

U.S. PATENT DOCUMENTS

| | | | |
|---|---|---|---|
| 2013/0087845 A1* | 4/2013 | Yasuda | H01L 29/40117 257/324 |
| 2013/0164905 A1 | 6/2013 | Yang et al. | |
| 2015/0132915 A1* | 5/2015 | Park | H01L 29/40114 438/287 |
| 2017/0092505 A1* | 3/2017 | Nakao | H01L 21/3065 |
| 2017/0179152 A1 | 6/2017 | Toyama et al. | |
| 2020/0020713 A1 | 1/2020 | Choi et al. | |
| 2020/0058672 A1* | 2/2020 | Nishikawa | H01L 29/40117 |
| 2021/0066339 A1* | 3/2021 | Kadota | H01L 27/11565 |
| 2021/0193678 A1* | 6/2021 | Noh | H10B 43/27 |
| 2021/0242235 A1* | 8/2021 | Lee | H10B 43/40 |

FOREIGN PATENT DOCUMENTS

| | | |
|---|---|---|
| CN | 107810552 A | 3/2018 |
| CN | 108682674 A | 10/2018 |
| CN | 108831887 A | 11/2018 |
| CN | 109075174 A | 12/2018 |
| CN | 109496358 A | 3/2019 |
| CN | 109712977 A | 5/2019 |
| CN | 109712987 A | 5/2019 |
| CN | 109712988 A | 5/2019 |
| CN | 109887918 A | 6/2019 |
| CN | 110071112 A | 7/2019 |
| CN | 110520984 A | 11/2019 |
| CN | 110600475 A | 12/2019 |
| CN | 110785851 A | 2/2020 |
| CN | 110797343 A | 2/2020 |
| CN | 110808253 A | 2/2020 |
| CN | 110876280 A | 3/2020 |
| WO | 2016076955 A1 | 5/2016 |

* cited by examiner

THREE-DIMENSIONAL MEMORY DEVICE WITH REDUCED LOCAL STRESS

CROSS-REFERENCE TO RELATED APPLICATIONS

This application is continuation of International Application No. PCT/CN2020/082533, filed on Mar. 31, 2020, entitled "THREE-DIMENSIONAL MEMORY DEVICE AND METHOD FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a substrate, a memory stack including interleaved conductive layers and dielectric layers above the substrate, and a channel structure extending vertically through the memory stack. The channel structure includes a high dielectric constant (high-k) dielectric layer disposed continuously along a sidewall of the channel structure, a memory film over the high-k dielectric layer along the sidewall of the channel structure, and a semiconductor channel over the memory film along the sidewall of the channel structure.

In another example, a method for forming a 3D memory device is disclosed. A first opening extending vertically through a first dielectric deck including a first plurality of interleaved sacrificial layers and dielectric layers above a substrate is formed. A high-k dielectric layer and a channel sacrificial layer free of polysilicon are subsequently formed along a sidewall of the first opening. A second opening extending vertically through a second dielectric deck including a second plurality of interleaved sacrificial layers and dielectric layers on the first dielectric deck is formed to expose the channel sacrificial layer in the first opening. The channel sacrificial layer is removed in the first opening. A memory film and a semiconductor channel are subsequently formed over the high-k dielectric layer along sidewalls of the first and second openings.

In still another example, a method for forming a 3D memory device is disclosed. A first opening extending vertically through a first dielectric deck including a first plurality of interleaved sacrificial layers and dielectric layers above a substrate is formed. A channel sacrificial layer including a material other than polysilicon is formed along a sidewall of the first opening. A second opening extending vertically through a second dielectric deck including a second plurality of interleaved sacrificial layers and dielectric layers on the first dielectric deck is formed to expose the channel sacrificial layer in the first opening. The channel sacrificial layer is removed in the first opening. A memory film and a semiconductor channel are subsequently formed along sidewalls of the first and second openings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
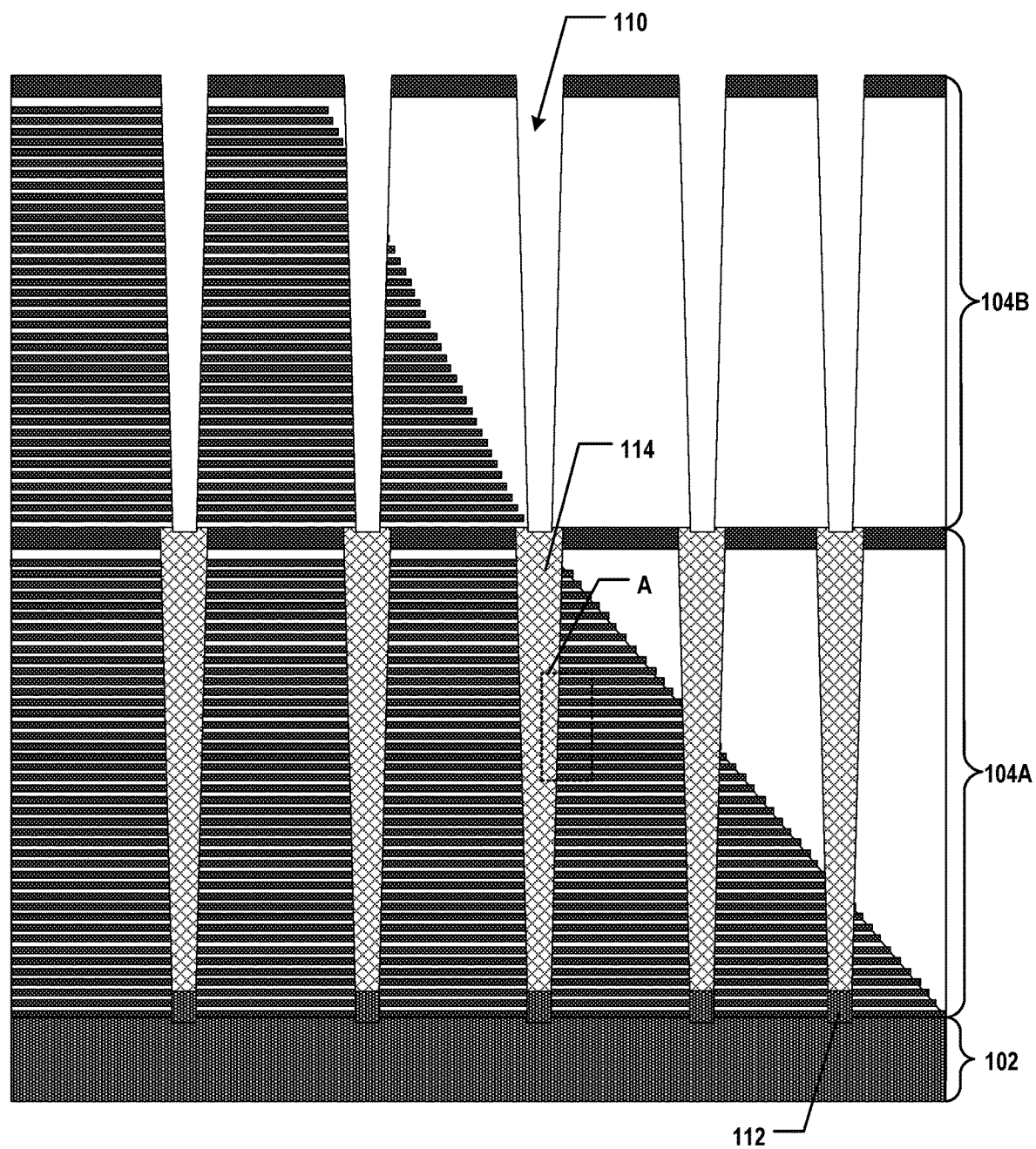
FIG. 1A illustrates a cross-section of an intermediate structure at a fabrication stage for forming a 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In fabricating 3D NAND memory devices with advanced technologies, such as having 96 or more levels, a dual-deck architecture is usually used, which requires removal of a polysilicon channel sacrificial layer that fills the lower channel hole in the lower deck on which the upper channel hole and upper deck can be formed.

Figure 1B:
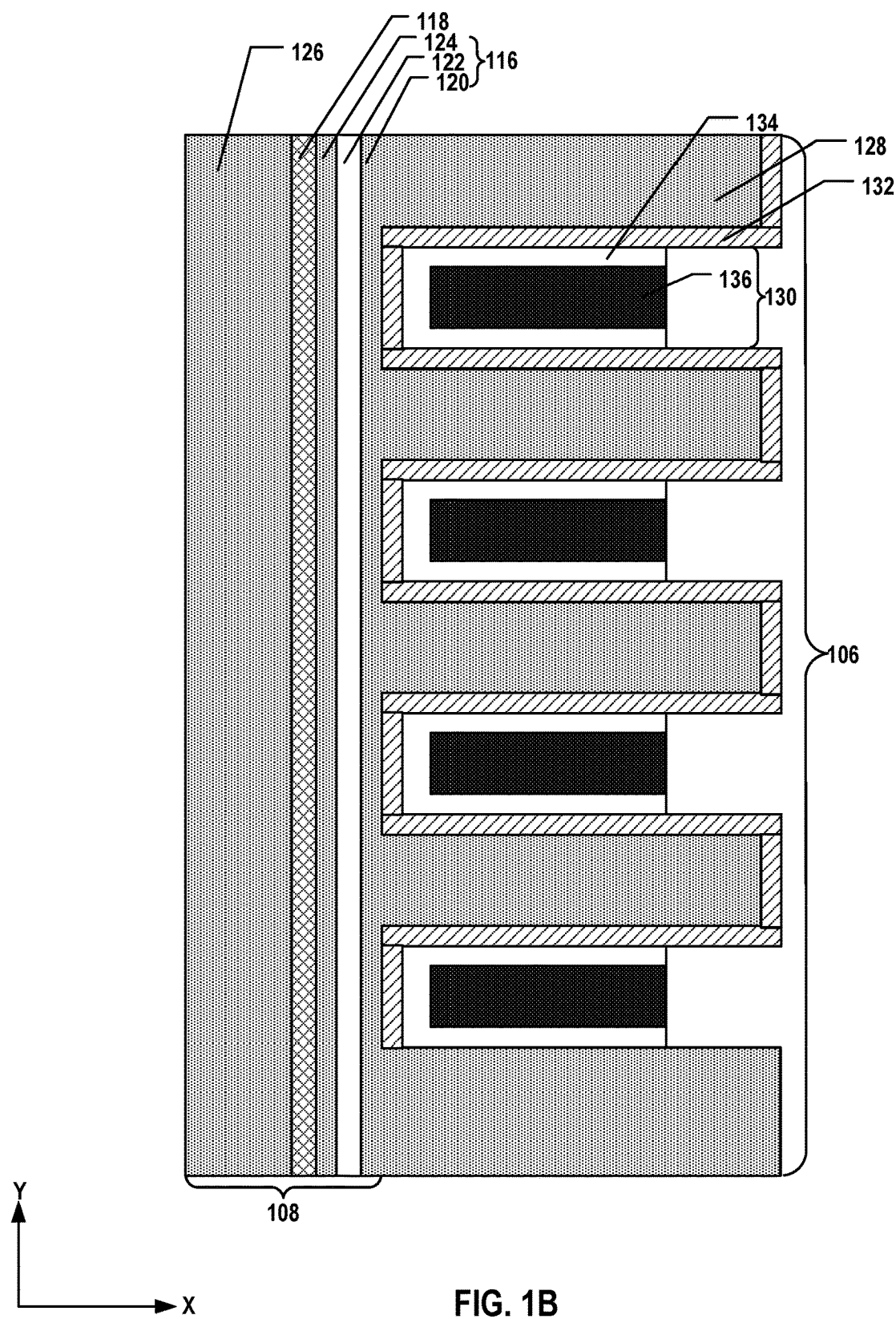
FIG. 1B illustrates a cross-section of the 3D memory device fabricated from the intermediate structure in FIG. 1A.

For example, FIG. 1A illustrates a cross-section of an intermediate structure 100 at a fabrication stage for forming a 3D memory device 101 in FIG. 1B. FIG. 1B illustrates a cross-section of 3D memory device 101 fabricated from intermediate structure 100 in FIG. 1A. It is understood that FIG. 1B illustrates a representative part of a full 3D memory device corresponding to, e.g., region A of intermediate structure 100 in FIG. 1A. As shown in FIG. 1A, intermediate structure 100 includes a dual-deck dielectric stack having a lower dielectric deck 104A and an upper dielectric deck 104B. Each of lower and upper dielectric decks 104A and 104B includes a plurality of pairs each including a dielectric layer 128 (shown in FIG. 1B) and a sacrificial layer (referred to herein as "dielectric layer pairs") formed above a substrate 102. It is noted that x and y axes are included in FIGS. 1A and 1B to further illustrate the spatial relationship of the components in 3D memory device 101 (and intermediate structure 100 thereof). Substrate 102 of 3D memory device 101 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 101) is determined relative to the substrate of the 3D memory device (e.g., substrate 102) in the y-direction (i.e., the vertical direction) when the substrate is positioned in the lowest plane of the 3D memory device in the y-direction. The same notion for describing the spatial relationship is applied throughout the present disclosure.

Once all the fabrication processes are finished, the dielectric stack (including lower and upper dielectric decks 104A and 104B) is replaced with a memory stack 106 (shown in FIG. 1B) by a gate replacement process, which replaces each sacrificial layer with a conductive layer 130 (shown in FIG. 1B). A lower channel hole filled with a channel sacrificial layer 114 and an upper channel hole 110 and are formed through lower dielectric deck 104A and upper dielectric deck 104B, respectively, in which a channel structure 108 (shown in FIG. 1B) is formed. As shown in FIG. 1A, intermediate structure 100 also includes a semiconductor plug 112 at the lower end (in the bottom portion) of the lower channel hole.

Channel sacrificial layer 114 is filled with polysilicon, which can be removed after the formation of upper channel hole 110 to re-open the lower channel hole. However, channel sacrificial layer 114 filled with polysilicon can introduce local stress after depositing polysilicon into the lower channel holes and annealing, which may cause significant wafer bow (e.g., greater than 200 μm). As a result, the subsequent processes, such as the formation of upper dielectric deck 104B and the etching of upper channel hole 110, may fail due to the large wafer bow, which affects the production yield.

Figure 3A:
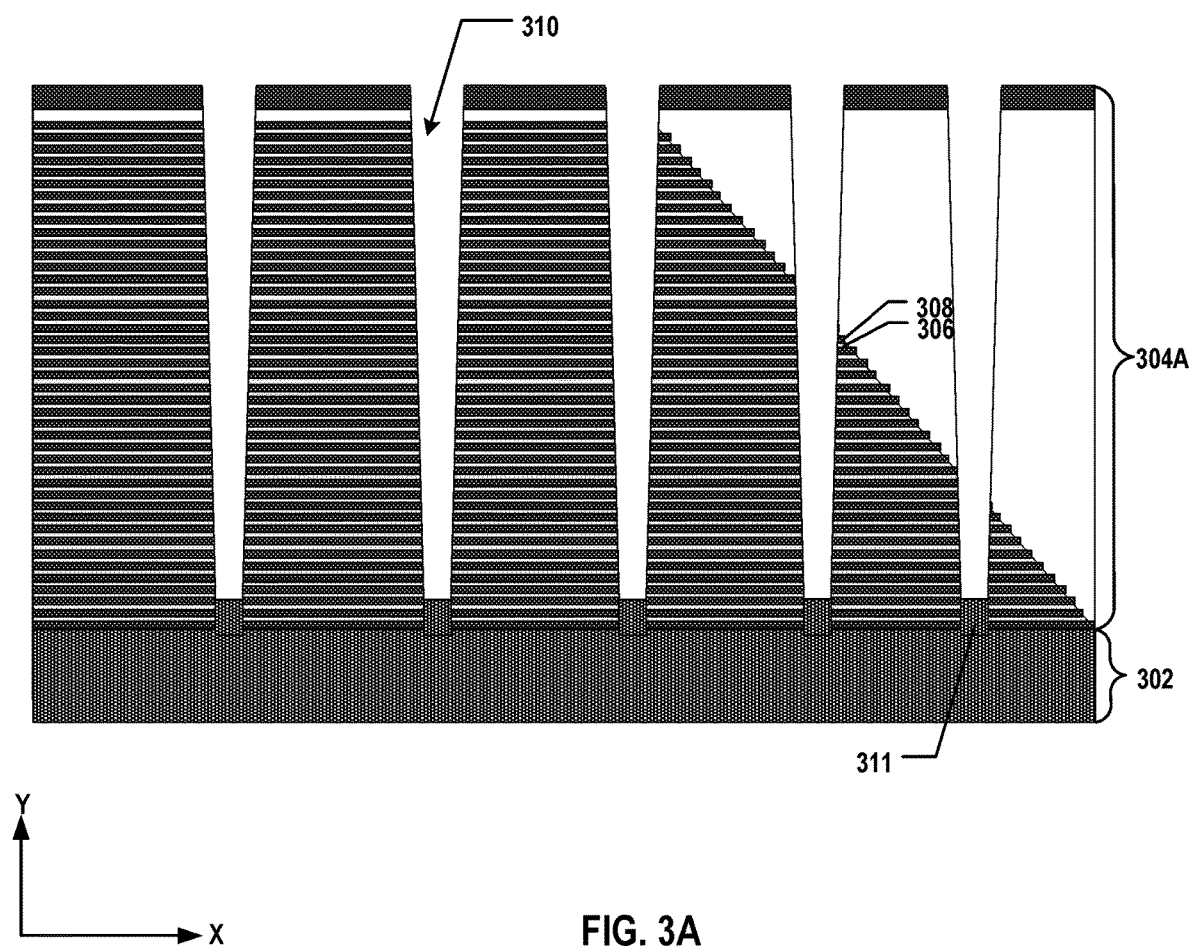
FIGS. 3A-3I illustrate an exemplary fabrication process for forming a 3D memory device, according to some embodiments of the present disclosure.
Figure 3B:
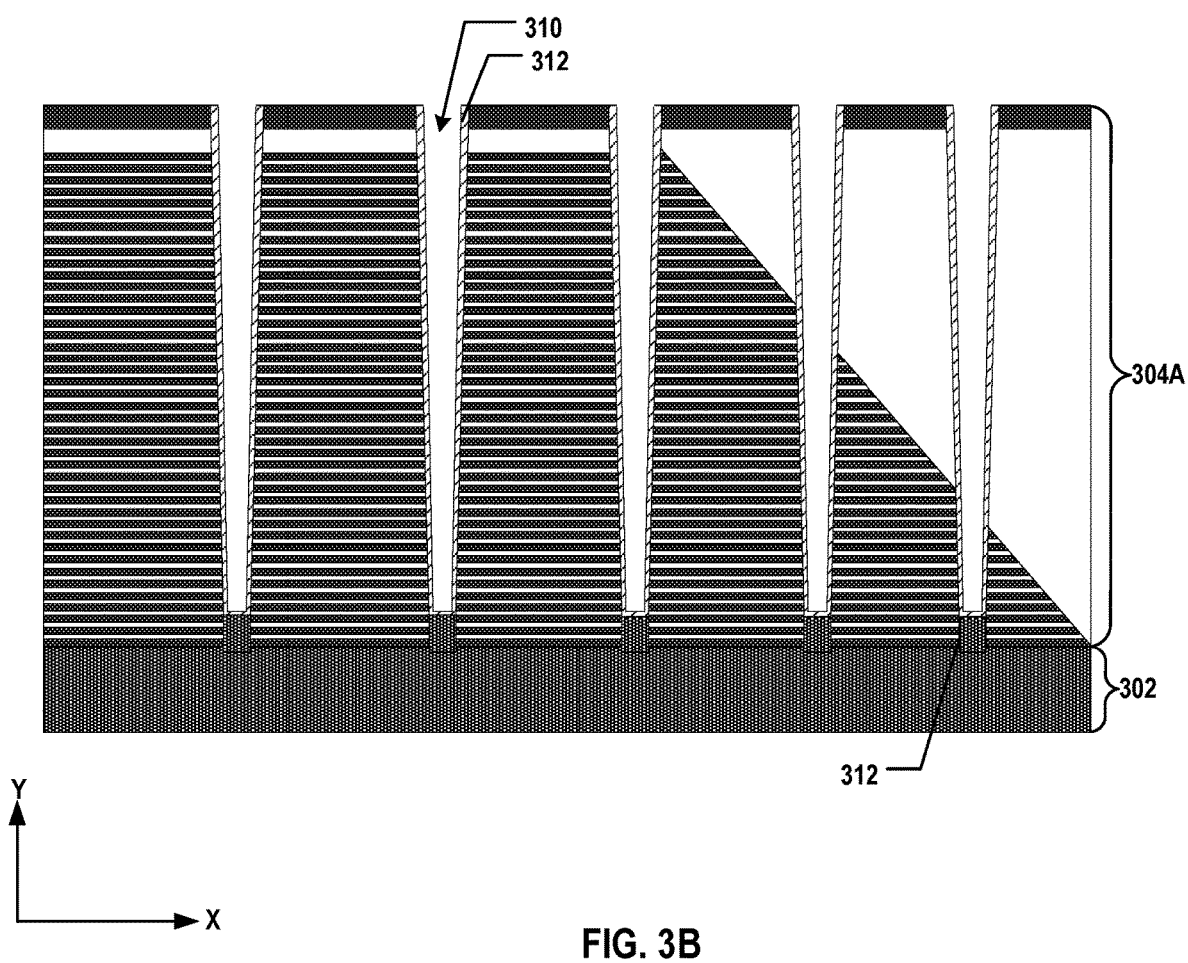
Figure 3C:
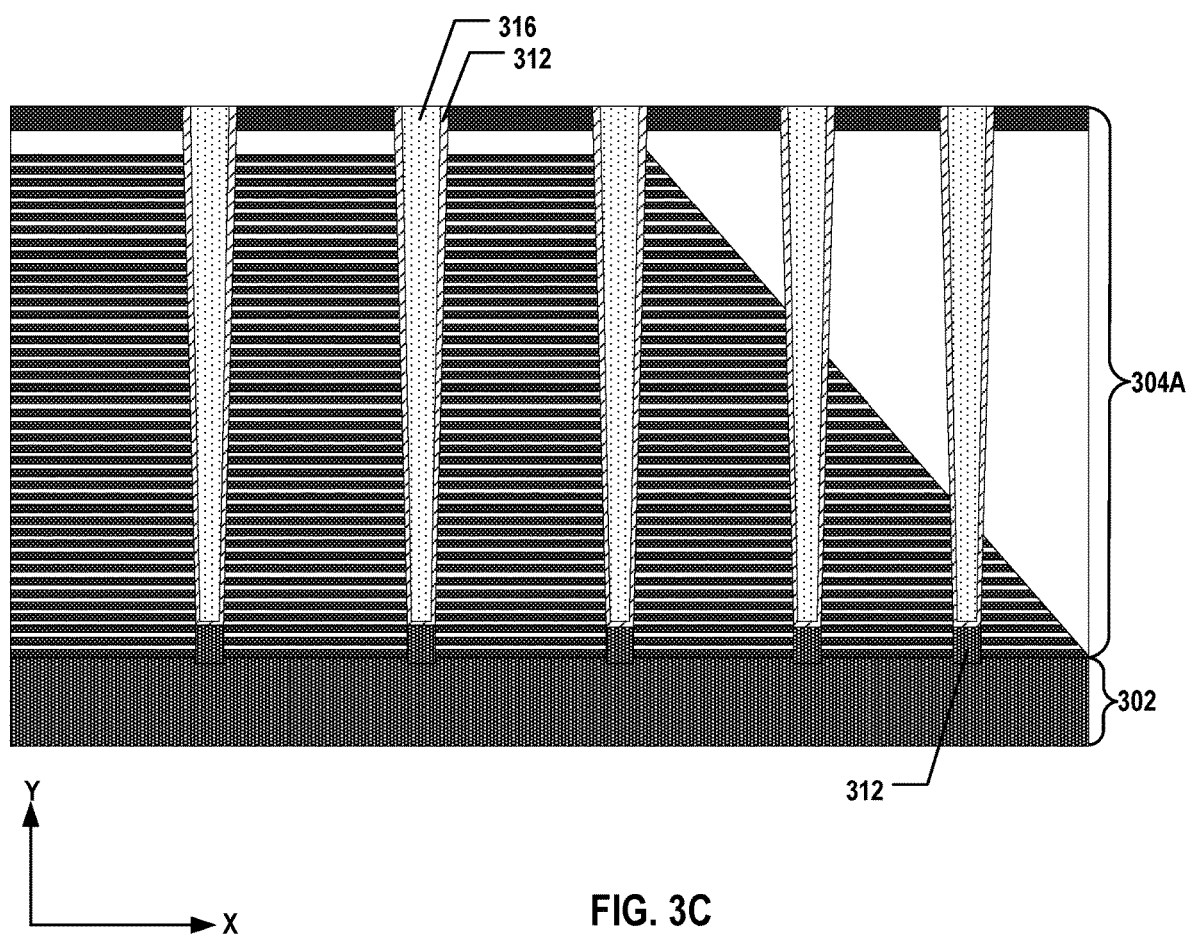
Figure 3D:
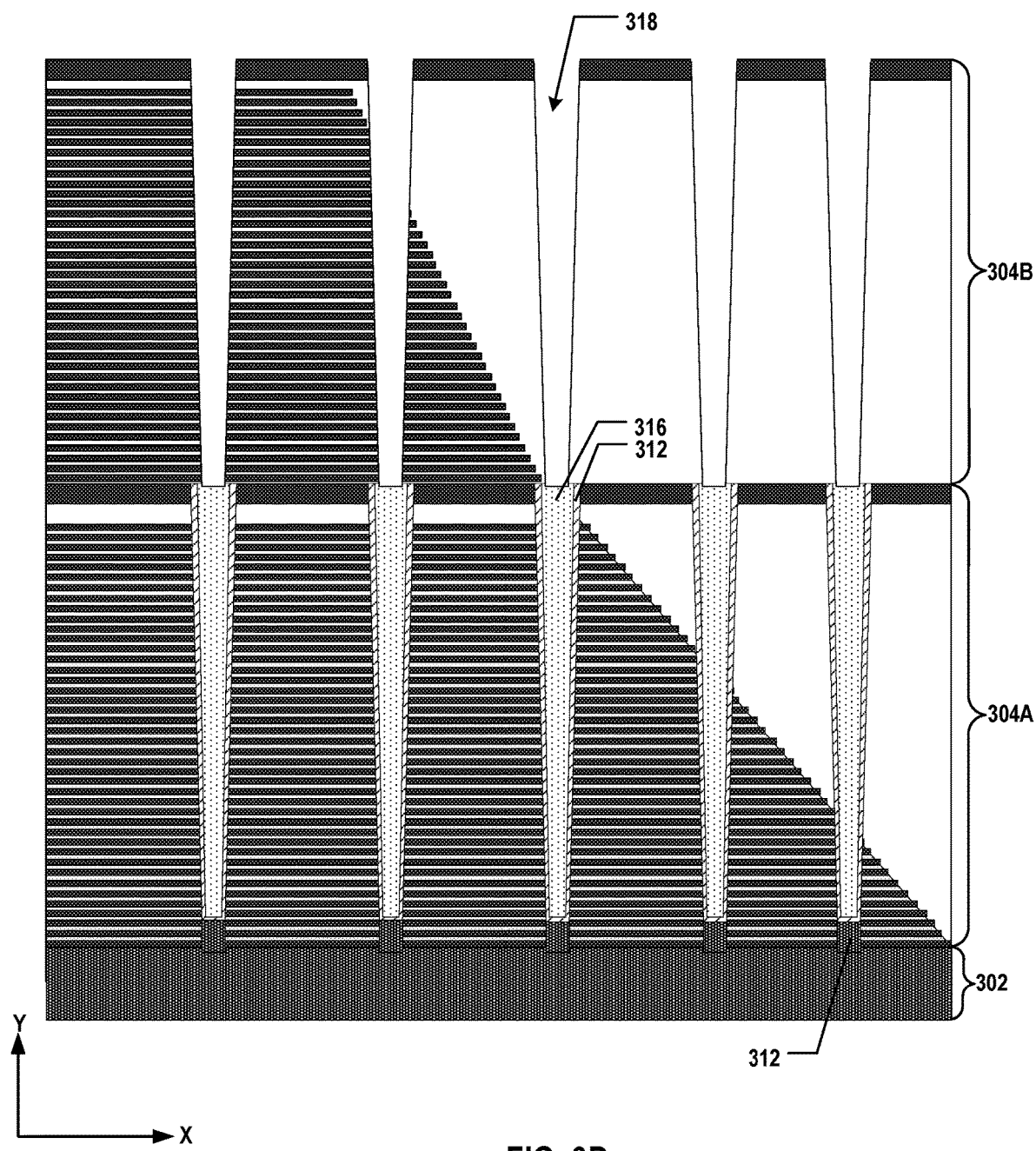

As shown in FIG. 1B, 3D memory device 101 includes channel structure 108 formed in upper channel hole 110 and the re-opened lower channel hole after the removal of channel sacrificial layer 114 therein. Channel structure 108 includes a memory film 116 (having a blocking layer 120, a storage layer 122, and a tunneling layer 124), a semiconductor channel 118, and a capping layer 126. Channel structure 108 extends vertically through memory stack 106 including interleaved dielectric layers 128 and conductive layers 130. Each conductive layer 130 includes a gate electrode 136 (e.g., having tungsten (W)) and an adhesive layer 134 (e.g., having titanium nitride (TiN)).

Memory stack 106 further includes a high dielectric constant (high-k) dielectric layer 132 surrounding conductive layers 130 because high-k dielectric layer 132 is formed by depositing high-k dielectrics in the lateral recesses (formed by removing the sacrificial layers in lower and upper dielectric decks 104A and 104B) during the gate replacement process. As shown in FIG. 1B, discrete parts of high-k dielectric layer 132 are disposed laterally between conductive layers 130 (having gate electrodes 136) and memory film 116, serving as the gate dielectrics of memory cells, while other parts of high-k dielectric layer 132 are disposed vertically between conductive layers 130 and dielectric layers 128. However, the parts of high-k dielectric layer 132 vertically between conductive layers 130 and dielectric layers 128 do not function as gate dielectrics, but instead, occupy the space for gate electrodes 136. As the dimension of each gate electrode 136 in the vertical direction is reduced due to high-k dielectric layer 132, the resistance of each gate electrode 136 is increased, thereby affecting the electrical performance of 3D memory device 101.

Various embodiments in accordance with the present disclosure provide an improved method for forming a multi-deck 3D memory device with reduced local stress caused by the sacrificial layers filling in the lower channel holes to reduce wafer bow. In some embodiments, the channel sacrificial layer includes material other than polysilicon, such as silicon oxide, with lower local stress than polysilicon. In some embodiments, a high-k dielectric layer and a channel sacrificial layer free of polysilicon are subsequently formed in the lower channel hole to reduce the local stress. By forming the high-k dielectric layer along the sidewall of the channel holes, as opposed to being in the lateral recesses between the dielectric layers during gate replacement, the vertical dimension of each gate electrode formed in the lateral recess after the gate replacement process can be increased, thereby reducing the resistance of each gate electrode in the final products of 3D memory devices. As a result, both the yield and electrical performance of the 3D memory devices can be improved.

Figure 2:
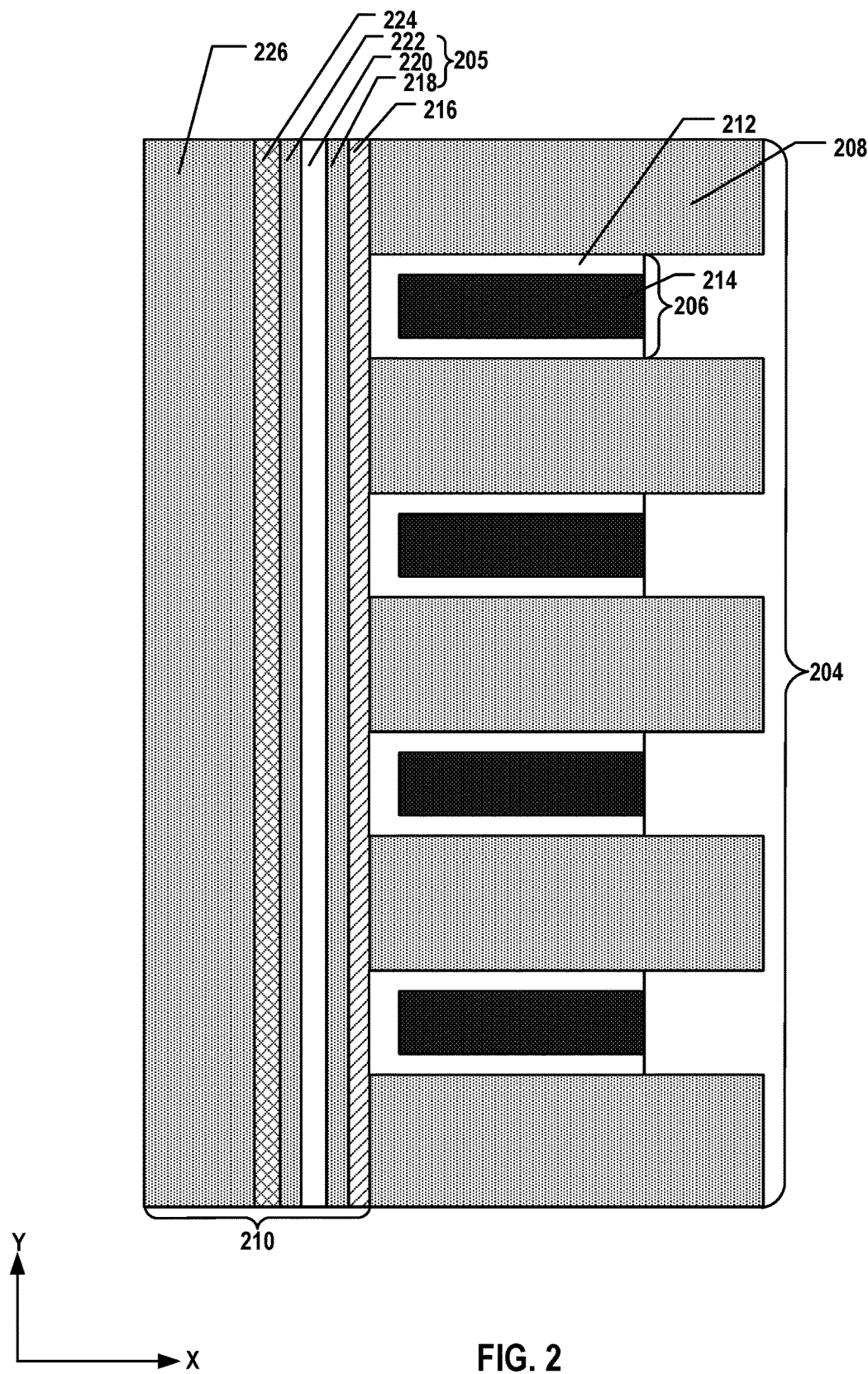
FIG. 2 illustrates a cross-section of an exemplary 3D memory device, according to some embodiments of the present disclosure.

FIG. 2 illustrates a cross-section of an exemplary 3D memory device 200, according to some embodiments of the present disclosure. It is understood that FIG. 2 illustrates a representative part of a full 3D memory device corresponding to a counterpart 3D memory device 101 in FIG. 1B. 3D memory device 200 can include a substrate (not shown), which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, the substrate is a thinned substrate (e.g., a semiconductor layer), which was thinned by grinding, etching, chemical mechanical polishing (CMP), or any combination thereof.

3D memory device 200 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 200 can be part of a non-monolithic 3D memory device, in which components (e.g., the peripheral device and memory array device) can be formed separately on different substrates and then bonded, for example, in a face-to-face manner. In some embodiments, the memory array device substrate remains as the substrate of the bonded non-monolithic 3D memory device, and the peripheral device (e.g., including any suitable digital, analog, and/or mixed-signal peripheral circuits used for facilitating the operation of 3D memory device 200, such as page buffers, decoders, and latches; not shown) is flipped and faces down toward the memory array device (e.g., NAND memory strings) for hybrid bonding. It is understood that in some embodiments, the memory array device substrate is flipped and faces down toward the peripheral device (not shown) for hybrid bonding, so that in the bonded non-monolithic 3D memory device, the memory array device is above the peripheral device. The memory array device substrate can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 200 is a NAND Flash memory device in which memory cells are provided in the form of an array of NAND memory strings extending vertically above the substrate. 3D memory device 200 can include a plurality of pairs each including a conductive layer 206 and a dielectric layer 208 (referred to herein as "conductive/dielectric layer pairs"). The stacked conductive/dielectric layer pairs are also referred to herein as a memory stack 204. The number of the conductive/dielectric layer pairs in memory stack 204 (e.g., 32, 64, 96, 128, 160, 192, 256, etc.) can determine the number of memory cells in 3D memory device 200. Memory stack 204 can include a plurality of interleaved conductive layers 206 and dielectric layers 208. Conductive layers 206 and dielectric layers 208 in memory stack 204 can alternate in the vertical direction.

Dielectric layers 208 can include dielectric materials including, but not limited to, silicon oxide, silicon nitride, silicon oxynitride, or any combination thereof. Each conductive layer 206 can include a gate electrode 214 and an adhesive layer 212. Gate electrode 214 can include conductive materials including, but not limited to, tungsten (W), cobalt (Co), copper (Cu), aluminum (Al), polysilicon, doped silicon, silicides, or any combination thereof. Adhesive layer 212 can include conductive materials that facilitate the deposition of gate electrode 214 (e.g., adhering gate electrode 214 over the surface of dielectric layers 208), including, but not limited to, titanium (Ti), TiN, tantalum (Ta), tantalum nitride (TaN), Ti/TN, or Ta/TaN. In some embodiments, gate electrodes 214 include tungsten, adhesive layers 212 include TiN, and dielectric layers 208 include silicon oxide. In some embodiments, conductive layer 206 include multiple gate electrodes 214 of multiple NAND memory cells in the same plane and can extend laterally in the x-direction as a word line ending at the edge of memory stack 204 (e.g., in a staircase structure).

Different from 3D memory device 101 in FIG. 1B in which adhesive layer 134 is vertically between gate electrode 136 and high-k dielectric layer 132, adhesive layer 212 in FIG. 2 is vertically between gate electrode 214 and at least one of dielectric layers 208, according to some embodiments. That is, in some embodiments, adhesive layer 212 in 3D memory device 200 is in contact with dielectric layers 208, as opposed to being separated from dielectric layers 208 by a high-k dielectric layer (e.g., high-k dielectric layer 132 separating dielectric layers 128 and adhesive layer 134 in FIG. 1B). As described below in detail, adhesive layer 134 can be deposited into the lateral recesses between dielectric layers 208 without first depositing a high-k dielectric layer.

Each NAND memory string of 3D memory device 200 can include a channel structure 210 extending vertically through memory stack 204. Channel structure 210 can include a channel hole filled with semiconductor material(s) (e.g., as a semiconductor channel 224) and dielectric material(s) (e.g., as a memory film 205). In some embodiments, semiconductor channel 224 includes silicon, such as amorphous silicon, polysilicon, or single crystalline silicon. In some embodiments, memory film 205 is a composite layer including a tunneling layer 222, a storage layer 220 (also known as a "charge trap layer"), and a blocking layer 218. The remaining space of channel structure 210 can be partially or fully filled with a capping layer 226 including dielectric materials, such as silicon oxide. Channel structure 210 can have a cylinder shape (e.g., a pillar shape). Capping layer 226, semiconductor channel 224, tunneling layer 222, storage layer 220, and blocking layer 218 are arranged radially from the center toward the outer surface of the pillar in this order, according to some embodiments. Tunneling layer 222 can include silicon oxide, silicon oxynitride, or any combination thereof. Storage layer 220 can include silicon nitride, silicon oxynitride, silicon, or any combination thereof. Blocking layer 218 can include silicon oxide, silicon oxynitride, high-k dielectrics, or any combination thereof. In one example, memory film 205 can include a composite layer of silicon oxide/silicon oxynitride/silicon oxide (ONO).

In some embodiments, channel structure 210 of 3D memory device 200 further includes a high-k dielectric layer 216 disposed continuously along the sidewall of channel structure 210 (e.g., the channel hole in which channel structure 210 is formed). Memory film 205 is disposed over high-k dielectric layer 216 along the sidewall of channel structure 210, and semiconductor channel 224 is disposed over memory film 205 along the sidewall of channel structure 210, according to some embodiments. High-k dielectric layer 216 can include high-k dielectrics including, but not limited to, aluminum oxide ($Al_2O_3$), hafnium oxide ($HfO_2$), zirconium oxide ($ZrO_2$), tantalum oxide ($Ta_2O_5$), titanium oxide ($TiO_2$), or any combination thereof. It is understood that high-k dielectric layer 216 may be a composite layer including one or more layers of high-k dielectrics. High-k dielectric layer 216 can serve as the gate dielectrics laterally between gate electrodes 214 and semiconductor channel 224 in the x-direction.

Different from high-k dielectric layer 132 of 3D memory device 101 in FIG. 1B, which has parts extending laterally between gate electrodes 136 and dielectric layers 128, high-k dielectric layer 216 in FIG. 2 continuously extends in the y-direction and does not extend laterally between gate electrodes 214 and dielectric layers 208, according to some embodiments. Because each conductive layer 206 (including gate electrode 214 and adhesive layer 212) can be in contact with dielectric layers 208s without an intervening high-k dielectric layer (e.g., 132 in FIG. 1B), the dimension of each gate electrode 214 in the y-direction can be increased compared with that of each gate electrode 136 in FIG. 1B. Thus, the resistance of each gate electrode 214 can be decreased, thereby improving the electrical performance of 3D memory device 200. Moreover, by replacing serpentine high-k dielectric layer 132 with straight high-k dielectric layer 216, the amount of high-k dielectric material used during fabrication can be saved as well.

In some embodiments, memory stack 204 has a dual-deck architecture, which includes a lower memory deck and an upper memory deck on the lower memory deck (not shown). The numbers of conductive/dielectric layer pairs in each of the lower and upper memory decks can be the same or different. Channel structure 210 can include a lower channel structure extending vertically through the lower memory deck, and an upper channel structure extending vertically through the upper memory deck (not shown).

Figure 3E:
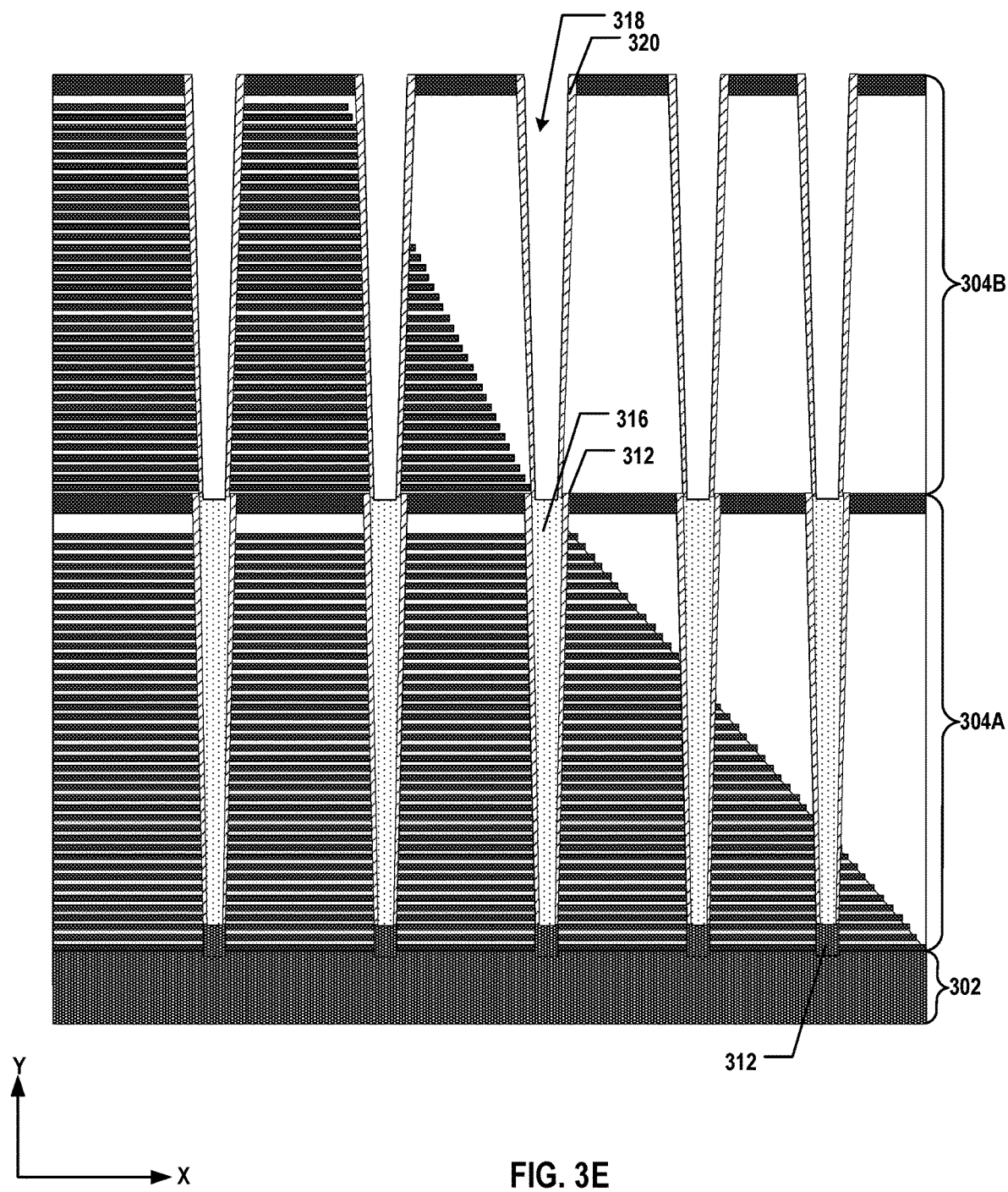
Figure 4A:
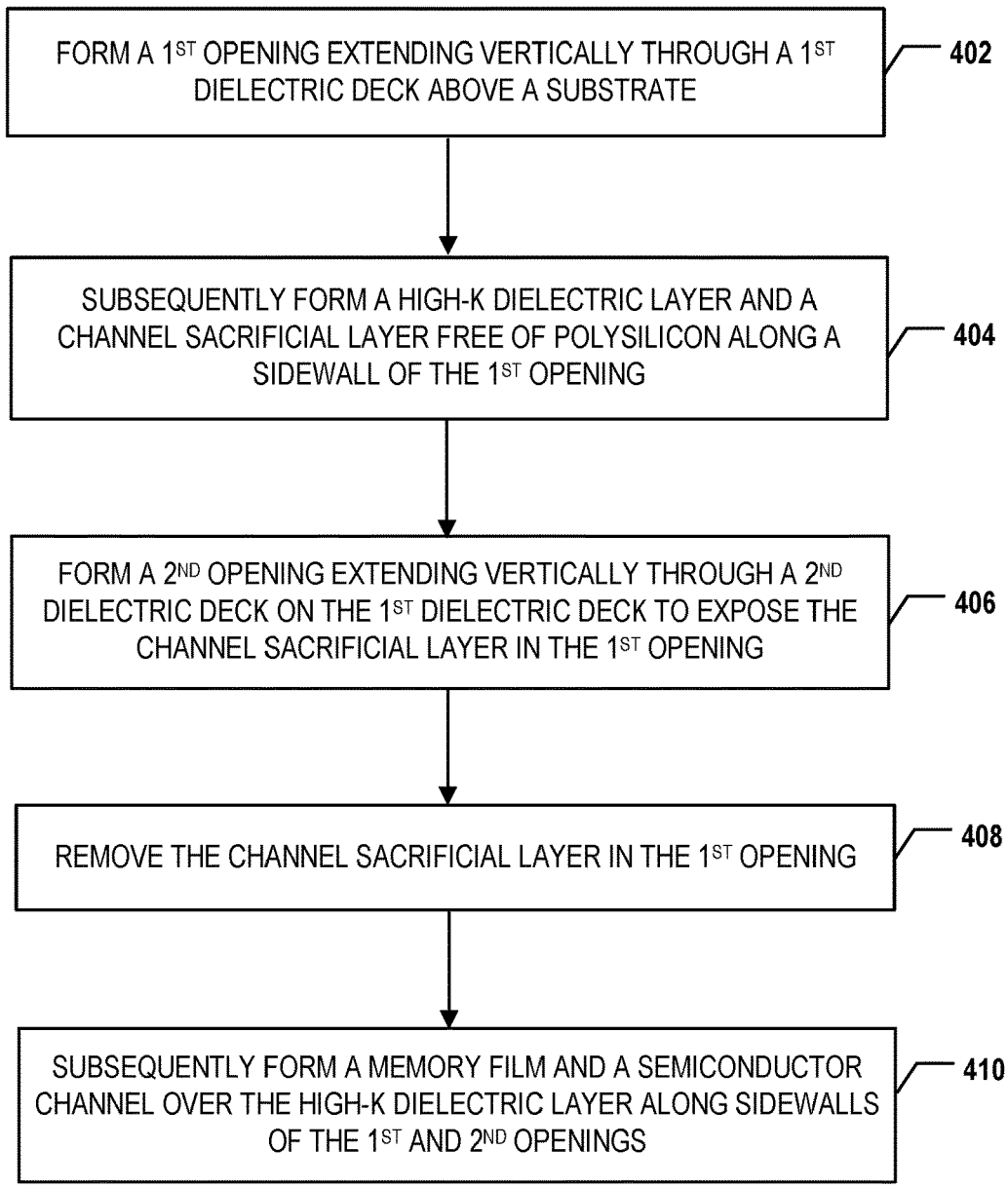
FIGS. 4A and 4B illustrate various flowcharts of an exemplary method for forming a 3D memory device, according to some embodiments of the present disclosure.
Figure 4B:
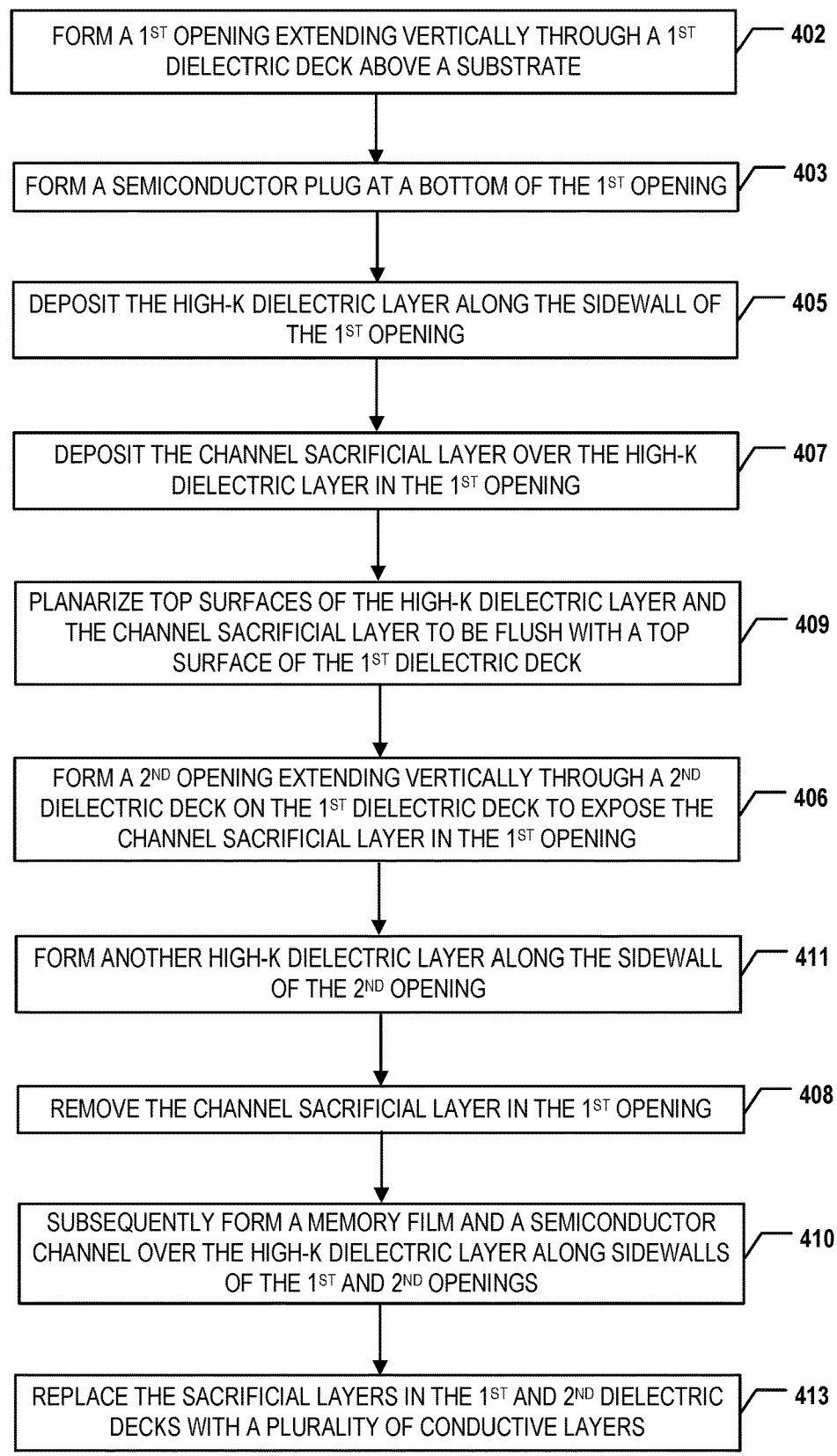
Figure 5:
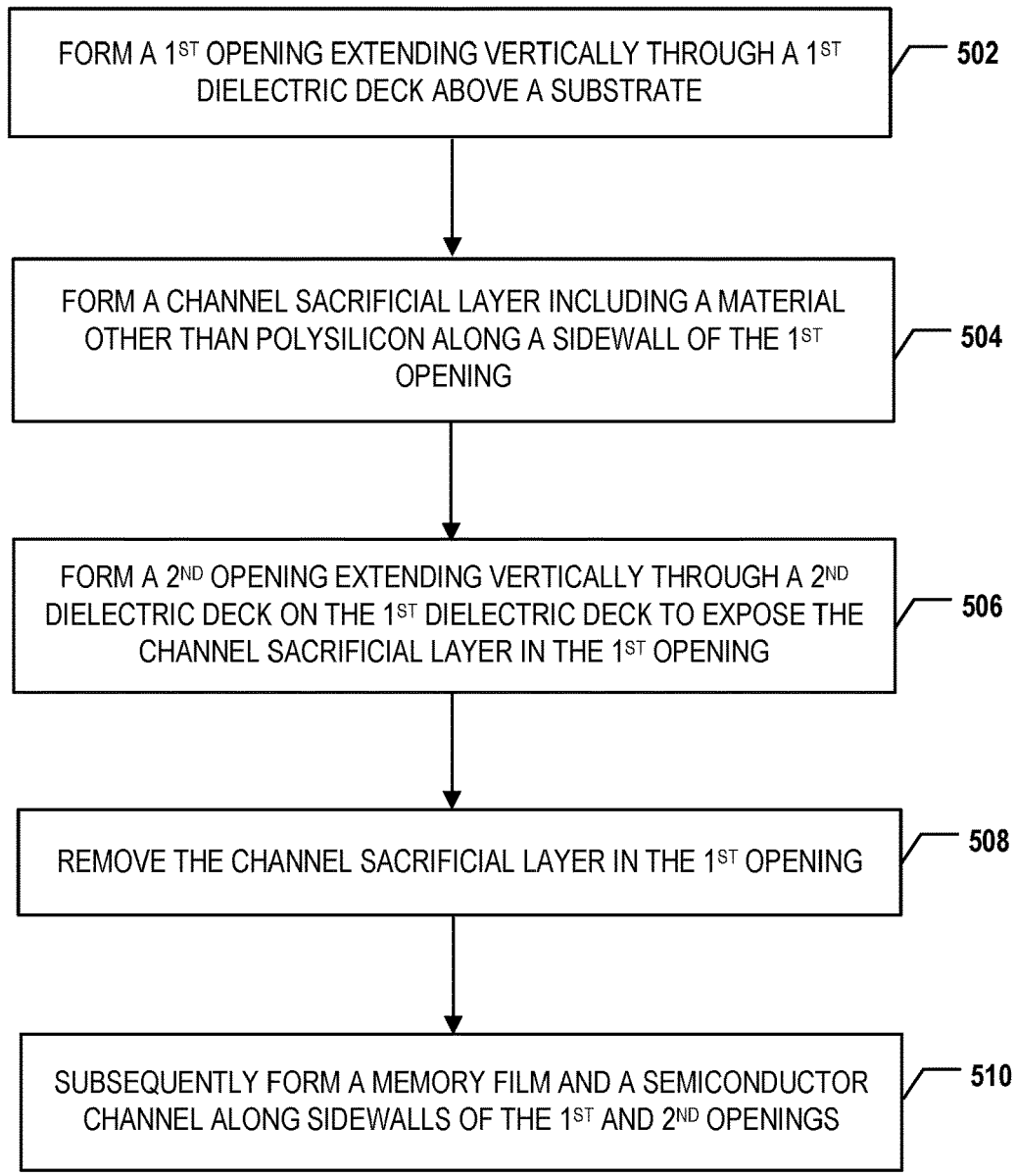
FIG. 5 illustrates a flowchart of another exemplary method for forming a 3D memory device, according to some embodiments of the present disclosure.

FIGS. 3A-3I illustrate an exemplary fabrication process for forming a 3D memory device, according to some embodiments of the present disclosure. FIGS. 4A and 4B illustrate various flowcharts of an exemplary method 400 for forming a 3D memory device, according to some embodiments of the present disclosure. FIG. 5 illustrates a flowchart of another exemplary method 500 for forming a 3D memory device, according to some embodiments of the present disclosure. Examples of the 3D memory device depicted in FIGS. 3A-3I, 4A, 4B, and 5 include 3D memory device 200 depicted in FIG. 2. FIGS. 3A-3I, 4A, 4B, and 5 will be described together. It is understood that the operations shown in methods 400 and 500 are not exhaustive and that other operations can be performed as well before, after, or between any of the illustrated operations. Further, some of the operations may be performed simultaneously, or in a different order than shown in FIGS. 4A, 4B, and 5.

Referring to FIG. 4A, method 400 starts at operation 402, in which a first opening extending vertically through a first dielectric deck above a substrate is formed. The first dielectric deck can include a first plurality of interleaved sacrificial layers and dielectric layers. The substrate can be a silicon substrate. Referring to FIG. 3A, a lower dielectric deck 304A including a plurality pairs of a first dielectric layer 306 and a second dielectric layer (known as a "sacrificial layer") 308 (together referred to herein as "dielectric layer pairs") is formed above a silicon substrate 302. In some embodiments, an insulation layer (not shown) is formed between lower dielectric deck 304A and silicon substrate 302 by depositing dielectric materials, such as silicon oxide, or thermal oxidation, on silicon substrate 302 prior to the formation of lower dielectric deck 304A. Lower dielectric deck 304A includes interleaved sacrificial layers 308 and dielectric layers 306, according to some embodiments. Dielectric layers 306 and sacrificial layers 308 can be alternatively deposited on silicon substrate 302 to form lower dielectric deck 304A. In some embodiments, each dielectric layer 306 includes a layer of silicon oxide, and each sacrificial layer 308 includes a layer of silicon nitride. Lower dielectric deck 304A can be formed by one or more thin film deposition processes including, but not limited to, chemical vapor deposition (CVD), physical vapor deposition (PVD), atomic layer deposition (ALD), or any combination thereof.

As illustrated in FIG. 3A, a lower channel hole 310 is an opening formed extending vertically through lower dielectric deck 304A. In some embodiments, a plurality of openings are formed through lower dielectric deck 304A, such that each opening becomes the location for forming a channel structure in the later process. In some embodiments, fabrication processes for forming lower channel hole 310 include wet etching and/or dry etching, such as deep-ion reactive etching (DRIE). In some embodiments, lower channel hole 310 extends further through the top portion of silicon substrate 302. The etching process through lower dielectric deck 304A may not stop at the top surface of silicon substrate 302 and may continue to etch part of silicon substrate 302. In some embodiments, a separate etching process is used to etch part of silicon substrate 302 after etching through lower dielectric deck 304A.

Method 400 proceeds to operation 404, as illustrated in FIG. 4A, in which a high-k dielectric layer and a channel sacrificial layer free of polysilicon are subsequently formed along a sidewall of the first opening. Referring to FIG. 4B, in some embodiments, prior to subsequently forming the high-k dielectric layer and the channel sacrificial layer, a semiconductor plug is formed at the bottom of the first opening at operation 403. In some embodiments, to subsequently form the high-k dielectric layer and the channel sacrificial layer, the high-k dielectric layer is deposited along the sidewall of the first opening at operation 405, the channel sacrificial layer is deposited over the high-k dielectric layer in the first opening at operation 407, and top surfaces of the high-k dielectric layer and the channel sacrificial layer are planarized to be flush with a top surface of the first dielectric deck at operation 409. In some embodiments, the high-k dielectric layer includes aluminum oxide, and the channel sacrificial layer includes silicon oxide.

As illustrated in FIG. 3A, a silicon plug 311 can be formed by filling the lower portion of lower channel hole 310 with single crystalline silicon epitaxially grown from silicon substrate 302 in any suitable directions (e.g., from the bottom surface and/or side surface). The fabrication processes for epitaxially growing silicon plug 311 can include, but not limited to, vapor-phase epitaxy (VPE), liquid-phase epitaxy (LPE), molecular-beam epitaxy (MPE), or any combinations thereof.

Different from the fabrication process shown in FIG. 1A for forming 3D memory device 101 in which channel sacrificial layer 114 including polysilicon, as illustrated in FIG. 3B, a high-k dielectric layer 312 is first formed along the sidewall of lower channel hole 310. In some embodiments, high-k dielectric layer 312 is formed at the bottom of lower channel hole 310 as well, e.g., on silicon plug 311. High-k dielectric layer 312 can be formed by depositing a layer of high-k dielectrics, such as aluminum oxide, into lower channel hole 310 using one or more thin film deposition processes including, but not limited to, CVD, PVD, ALD, or any combination thereof. In some embodiments, to form a thin, conformal film that does not fully fill lower channel hole 310, high-k dielectric layer 312 is deposited in lower channel hole 310 using ALD.

As illustrated in FIG. 3C, a channel sacrificial layer 316 is deposited over high-k dielectric layer 312 along the sidewall of lower channel hole 310 (shown in FIG. 3B). In some embodiments, channel sacrificial layer 316 fully fills lower channel hole 310. In some embodiments, channel sacrificial layer 316 partially fills lower channel hole 310, leaving an air gap (not shown) in between as long as the top portion of lower channel hole 310 is sealed by channel sacrificial layer 316. Different from channel sacrificial layer 114 including polysilicon in FIG. 1A, which can introduce local stress, channel sacrificial layer 316 in FIG. 3C can be free of polysilicon to reduce the local stress. Channel sacrificial layer 316 can include any suitable sacrificial material other than polysilicon, which introduces less local stress than polysilicon and can be selectively removed in a later process, such as silicon oxide, silicon nitride, or ceramic. In some embodiments, channel sacrificial layers 316 is formed by depositing a layer of silicon oxide over high-k dielectric layer 312 to fully or partially fill lower channel hole 310 using one or more thin film deposition processes including, but not limited to, CVD, PVD, ALD, or any combination thereof.

As illustrated in FIG. 3C, the top surface of high-k dielectric layer 312 and the top surface of channel sacrificial layer 316 are planarized to be flush with the top surface of lower dielectric deck 304A using CMP, grinding, and/or etching. In some embodiments, an annealing process, such as rapid thermal annealing (RTA), is performed after the formation of channel sacrificial layer 316. Due to the different material used for forming channel sacrificial layer 316, the local stress introduced by channel sacrificial layer 316, even after annealing, can be reduced compared with polysilicon channel sacrificial layers. As a result, wafer bow due to local stress can be reduced or minimized.

Method 400 proceeds to operation 406, as illustrated in FIG. 4A, in which a second opening extending vertically through a second dielectric deck on the first dielectric deck is formed to expose the channel sacrificial layer in the first opening. The second dielectric deck can include a second plurality of interleaved sacrificial layers and dielectric layers. Referring to FIG. 3D, an upper dielectric deck 304B including a plurality of dielectric layer pairs is formed on lower dielectric deck 304A. Upper dielectric deck 304B can be formed by one or more thin film deposition processes including, but not limited to, CVD, PVD, ALD, or any combination thereof.

As illustrated in FIG. 3D, an upper channel hole 318 is an opening formed extending vertically through upper dielectric deck 304B to expose channel sacrificial layer 316. Upper channel hole 318 can be aligned with lower channel hole 310 (shown in FIG. 3F) so as to expose at least part of channel sacrificial layer 316. Upper and lower channel holes 318 and 310 can be connected after channel sacrificial layer 316 is removed. In some embodiments, fabrication processes for forming upper channel hole 318 include wet etching and/or dry etching, such as DRIE. In some embodiments, upper channel hole 318 extends into part of channel sacrificial layer 316. The etching process through upper dielectric deck 304B may not stop at the top surface of channel sacrificial layer 316 and continue to etch part of channel sacrificial layer 316. In some embodiments, a separate etching process is used to etch part of channel sacrificial layer 316 after etching upper dielectric deck 304B.

Method 400 proceeds to operation 408, as illustrated in FIG. 4A, in which the channel sacrificial layer in the first opening is removed. Referring to FIG. 4B, in some embodiments, prior to removing the channel sacrificial layer, another high-k dielectric layer is formed along the sidewall of the second opening at operation 411. As illustrated in FIG. 3E, another high-k dielectric layer 320 is first formed along the sidewall of upper channel hole 318. High-k dielectric layer 320 can be formed by depositing a layer of the same high-k dielectric material as high-k dielectric layer 312, such as aluminum oxide, into upper channel hole 318 using one or more thin film deposition processes including, but not limited to, CVD, PVD, ALD, or any combination thereof. In some embodiments, to form a thin, conformal firm that does not fully fill upper channel hole 318, high-k dielectric layer 320 is deposited in upper channel hole 318 using ALD.

Figure 3F:
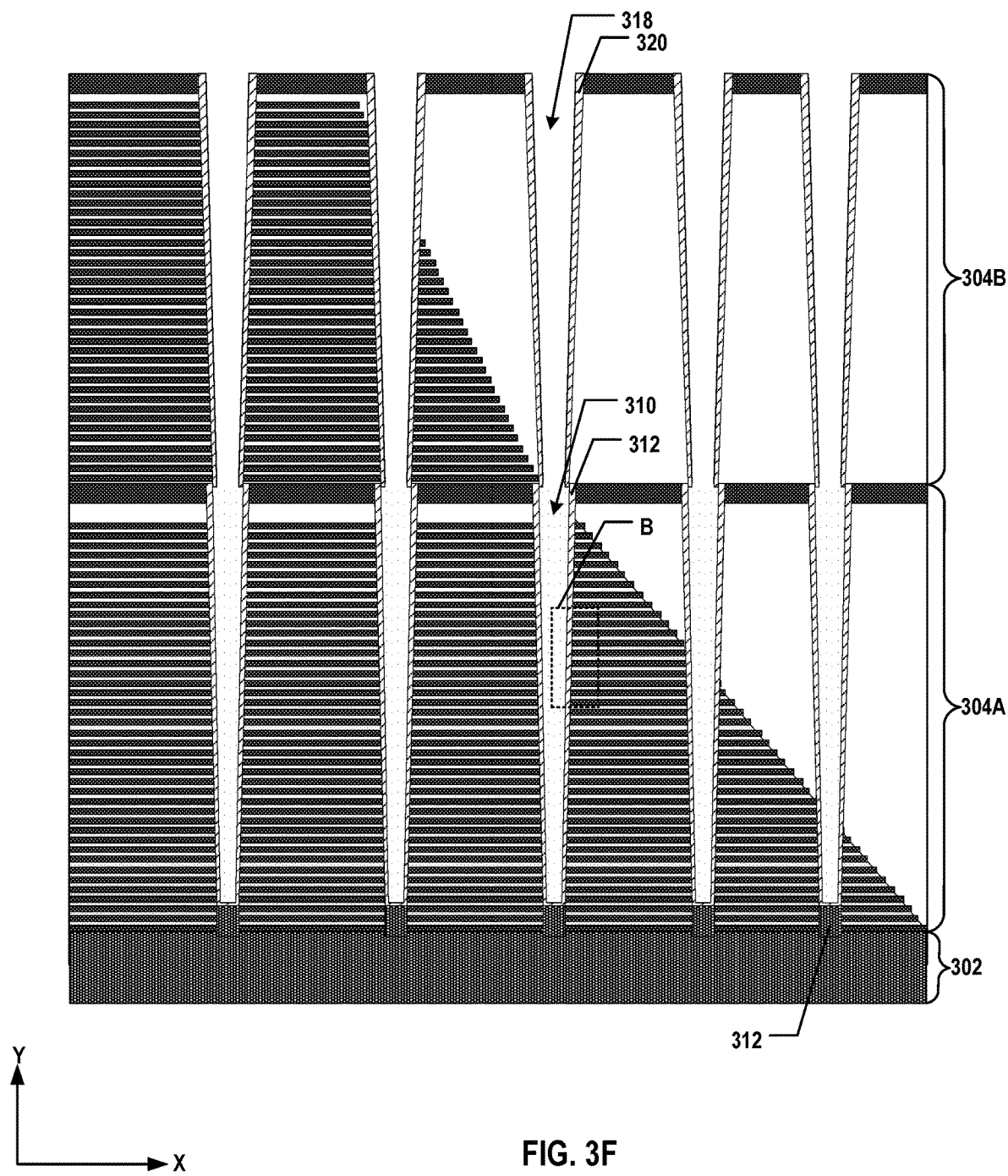

As illustrated in FIG. 3F, channel sacrificial layer 316 (shown in FIG. 3E) is removed in lower channel hole 312 by wet etching and/or dry etching. In some embodiments, channel sacrificial layer 316 includes silicon oxide, which can be etched by hydrofluoric acid (HF) etchants. High-k dielectric layer 312 laterally between channel sacrificial layer 316 (including e.g., silicon oxide) and dielectric layers 306 (including e.g., silicon oxide) can prevent the HF etchant from etching dielectric layers 306 when removing channel sacrificial layer 316. After the removal of channel sacrificial layer 316, lower channel hole 310 becomes open again and connected with upper channel hole 318, as shown in FIG. 3F.

Method 400 proceeds to operation 410, as illustrated in FIG. 4A, in which a memory film and a semiconductor channel are subsequently formed over the high-k dielectric layer along sidewalls of the first and second openings. In some embodiments, the memory film is formed over the high-k dielectric layer and the another high-k dielectric layer in the first and second openings, respectively. In some embodiments, to subsequently form the memory film and the semiconductor channel, a silicon oxide layer, a silicon nitride layer, a silicon oxide layer, and a polysilicon layer are subsequently deposited along the sidewalls of the first and second openings in this order.

Figure 3G:
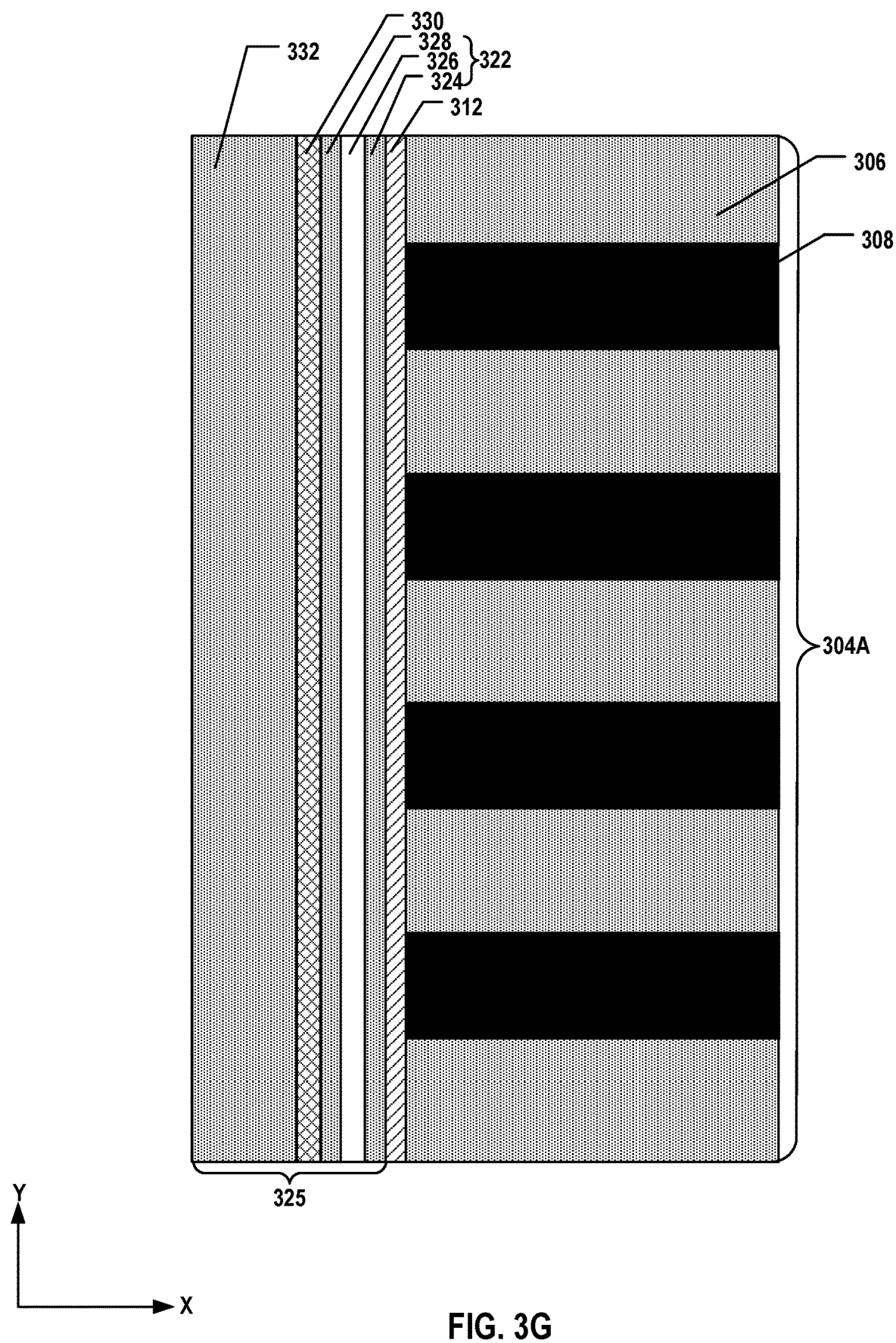

As illustrated in FIG. 3G, which corresponds to region B in FIG. 3F, a memory film 322 (including a blocking layer 324, a storage layer 326, and a tunneling layer 328) and a semiconductor channel 330 are formed over high-k dielectric layer 312 along the sidewall of lower channel hole 310 (shown in FIG. 3F). It is understood that although not shown in FIG. 3G, memory film 322 (including blocking layer 324, storage layer 326, and tunneling layer 328) and semiconductor channel 330 may be similarly formed over high-k dielectric layer 320 along the sidewall of upper channel hole 318 as well. In some embodiments, memory film 322 is first deposited along the sidewall of lower and upper channel holes 310 and 318, and semiconductor channel 330 is later deposited over memory film 322. Blocking layer 324, storage layer 326, and tunneling layer 328 can be subsequently deposited in this order using one or more thin film deposition processes, such as ALD, CVD, PVD, any other suitable processes, or any combination thereof, to form memory film 322. Semiconductor channel 330 can be later formed by depositing, for example, polysilicon over tunneling layer 328 using one or more thin film deposition processes, such as ALD, CVD, PVD, any other suitable processes, or any combination thereof. In some embodiments, a silicon oxide layer, a silicon nitride layer, a silicon oxide layer, and a polysilicon layer (a "SONO" structure) are subsequently deposited to form memory film 322 and semiconductor channel 330. In some embodiments, a capping layer 332, such as a silicon oxide layer, is formed in lower and upper channel holes 310 and 318 (shown in FIG. 3F) to fully or partially fill the remaining space of lower and upper channel holes 310 and 318 using one or more thin film deposition processes, such as CVD, PVD, ALD, electroplating, electroless plating, or any combination thereof. A channel structure 325 including high-k dielectric layer 312, memory film 322, semiconductor channel 330, and capping layer 332 is hereby formed, according to some embodiments.

Referring to FIG. 4B, in some embodiments, after subsequently forming the memory film and the semiconductor channel, the sacrificial layers in the first and second dielectric decks are replaced with a plurality of conductive layers at operation 413. In some embodiments, to replace, the sacrificial layers are removed to leave a plurality of lateral recesses between the dielectric layers in the first and second dielectric decks, a plurality of adhesive layers are deposited over the dielectric layers in the lateral recesses, and a plurality of gate electrodes are deposited over the adhesive layers in the lateral recesses. In some embodiments, the high-k dielectric layer does not extend between each of the adhesive layers and the adjacent dielectric layer.

Figure 3H:
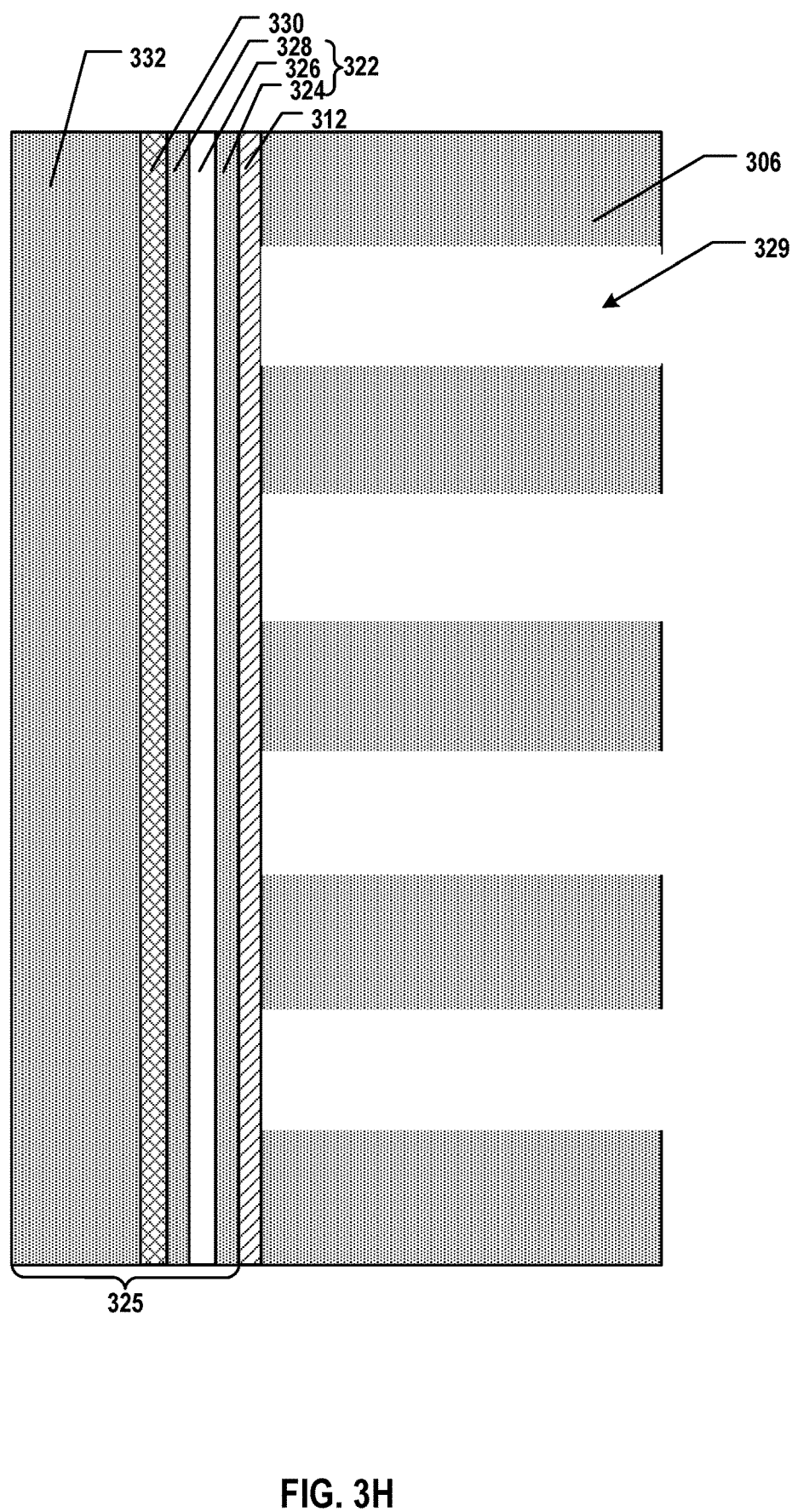

In some embodiments, slit openings (e.g., gate line slits (GLSs), not shown) are formed extending vertically through lower and upper dielectric decks 304A and 304B. As illustrated in FIG. 3H, sacrificial layers 308 (shown in FIG. 3F) in lower and upper dielectric decks 304A and 304B are selectively etched over dielectric layers 306 by applying etchants through the slit openings to form a plurality of lateral recesses 329 vertically between dielectric layers 306. For example, sacrificial layers 308 including silicon nitride may be selectively etched using phosphoric acid ($H_3PO_4$) etchant without etching dielectric layers 306 including silicon oxide.

Figure 3I:
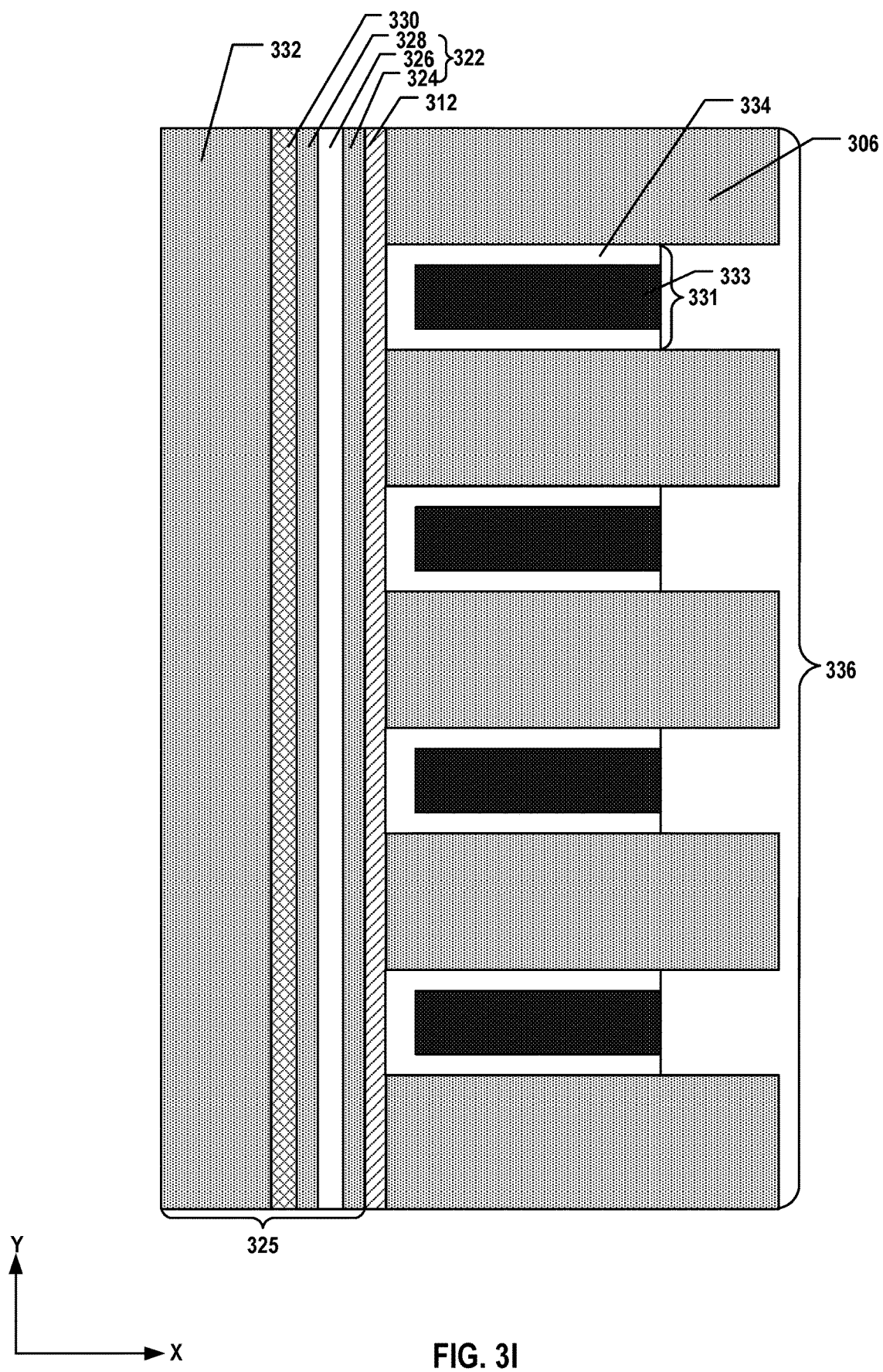

As illustrated in FIG. 3I, adhesive layers 334 are deposited over dielectric layers 306 in lateral recesses 329 (shown in FIG. 3H) using one or more thin film deposition processes, such as CVD, PVD, ALD, or any combination thereof. For example, a thin, conformal layer of TiN may be deposited over dielectric layers 306 in lateral recesses 329 through the slit openings using ALD to form adhesive layer 334. Adhesive layers 334 can be formed directly on dielectric layers 306 and thus, high-k dielectric layer 312 does not extend between adhesive layers 334 and adjacent dielectric layers 306.

As illustrated in FIG. 3I, gate electrodes 333 are deposited over adhesive layers 334 in lateral recesses 329 (shown in FIG. 3H) using one or more thin film deposition processes, such as CVD, PVD, ALD, electroplating, electroless plating, or any combination thereof. In some embodiments, each gate electrode 333 is deposited into the remaining space of respective lateral recess 329 to fully fill lateral recess 329 in order to reduce the resistance of gate electrode 333. For example, a layer of W may be deposited over adhesive layers 334 in lateral recesses 329 through the slit openings to form gate electrodes 333. Conductive layers 331 each including gate electrode 333 and adhesive layer 334 are hereby formed, replacing sacrificial layers 308 (shown in FIG. 3A). A dual-deck memory stack 336 can thus be formed by replacing sacrificial layers 308 in lower and upper dielectric decks 304A and 304B with conductive layers 331. Memory stack 336 can include interleaved conductive layers 331 and dielectric layers 306.

It is understood that in some embodiments, a high-k dielectric layer may not need to be formed continuously along the sidewall of the lower channel hole prior to the formation of the channel sacrificial layer in order to reduce the local stress and wafer bow caused by polysilicon channel sacrificial layer. Referring to FIG. 5, method 500 starts at operation 502, in which a first opening extending vertically through a first dielectric deck above a substrate is formed.

Method 500 proceeds to operation 504, as illustrated in FIG. 5, in which a channel sacrificial layer including a material other than polysilicon is formed along a sidewall of the first opening. In some embodiments, the material in the channel sacrificial layer includes ceramic. In some embodiments, the material in the channel sacrificial layer includes a dopant into polysilicon. That is, polysilicon can be doped to decrease its local stress in the lower dielectric stack. Thus, any suitable dopant that can reduce local stress can be added into polysilicon using ion implantation and/or thermal diffusion to form the channel sacrificial layer. In some embodiments, prior to forming the channel sacrificial layer, a semiconductor plug is formed at the bottom of the first opening.

Method 500 proceeds to operation 506, as illustrated in FIG. 5, in which a second opening extending vertically through a second dielectric deck on the first dielectric deck is formed to expose the channel sacrificial layer in the first opening. Method 500 proceeds to operation 508, as illustrated in FIG. 5, in which the channel sacrificial layer in the first opening is removed. Method 500 proceeds to operation 510, as illustrated in FIG. 5, in which a memory film and a semiconductor channel are subsequently formed along sidewalls of the first and second openings. In some embodiments, to subsequently form the memory film and the semiconductor channel, a silicon oxide layer, a silicon nitride layer, a silicon oxide layer, and a polysilicon layer are subsequently deposited along the sidewalls of the first and second openings in this order. In some embodiments, after subsequently forming the memory film and the semiconductor channel, the sacrificial layers in the first and second dielectric decks are replaced with a plurality of conductive layers. The details of operations 502, 506, 508, and 510 are substantially similar to their counterparts, i.e., operations 402, 406, 408, and 410, in FIG. 4A and thus, are not repeated for ease of description.

According to one aspect of the present disclosure, a 3D memory device includes a substrate, a memory stack including interleaved conductive layers and dielectric layers above the substrate, and a channel structure extending vertically through the memory stack. The channel structure includes a high dielectric constant (high-k) dielectric layer disposed continuously along a sidewall of the channel structure, a memory film over the high-k dielectric layer along the sidewall of the channel structure, and a semiconductor channel over the memory film along the sidewall of the channel structure.

In some embodiments, each of the conductive layers includes a gate electrode and an adhesive layer vertically between the gate electrode and at least one of the dielectric layers.

In some embodiments, the high-k dielectric layer does not extend between the gate electrode and the at least one of the dielectric layers. In some embodiments, the adhesive layer is in contact with the at least one of the dielectric layers.

In some embodiments, the high-k dielectric layer includes aluminum oxide.

In some embodiments, the memory film includes a blocking layer, a storage layer, and a tunneling layer.

In some embodiments, the memory stack includes a lower memory deck and an upper memory deck, and the channel structure includes a lower channel structure extending vertically through the lower memory deck, and an upper channel structure extending vertically through the upper memory deck.

According to another aspect of the present disclosure, a method for forming a 3D memory device is disclosed. A first opening extending vertically through a first dielectric deck including a first plurality of interleaved sacrificial layers and dielectric layers above a substrate is formed. A high-k dielectric layer and a channel sacrificial layer free of polysilicon are subsequently formed along a sidewall of the first opening. A second opening extending vertically through a second dielectric deck including a second plurality of interleaved sacrificial layers and dielectric layers on the first dielectric deck is formed to expose the channel sacrificial layer in the first opening. The channel sacrificial layer is removed in the first opening. A memory film and a semiconductor channel are subsequently formed over the high-k dielectric layer along sidewalls of the first and second openings.

In some embodiments, the high-k dielectric layer includes aluminum oxide, and the channel sacrificial layer includes silicon oxide.

In some embodiments, prior to subsequently forming the high-k dielectric layer and the channel sacrificial layer, a semiconductor plug is formed at a bottom of the first opening.

In some embodiments, after subsequently forming the memory film and the semiconductor channel, the sacrificial layers in the first and second dielectric decks are replaced with a plurality of conductive layers.

In some embodiments, to replace, the sacrificial layers are removed to leave a plurality of lateral recesses between the dielectric layers in the first and second dielectric decks, a plurality of adhesive layers are deposited over the dielectric layers in the lateral recesses, and a plurality of gate electrodes are deposited over the adhesive layers in the lateral recesses.

In some embodiments, the high-k dielectric layer does not extend between each of the adhesive layers and the adjacent dielectric layer.

In some embodiments, to subsequently form the high-k dielectric layer and the channel sacrificial layer, the high-k dielectric layer is deposited along the sidewall of the first opening, the channel sacrificial layer is deposited over the high-k dielectric layer in the first opening, and top surfaces of the high-k dielectric layer and the channel sacrificial layer are planarized to be flush with a top surface of the first dielectric deck.

In some embodiments, prior to removing the channel sacrificial layer, another high-k dielectric layer is formed along the sidewall of the second opening, such that the memory film is formed over the high-k dielectric layer and the another high-k dielectric layer in the first and second openings, respectively.

In some embodiments, to subsequently form the memory film and the semiconductor channel, a silicon oxide layer, a silicon nitride layer, a silicon oxide layer, and a polysilicon layer are comprises subsequently deposited along the sidewalls of the first and second openings in this order.

According to still another aspect of the present disclosure, a method for forming a 3D memory device is disclosed. A first opening extending vertically through a first dielectric deck including a first plurality of interleaved sacrificial layers and dielectric layers above a substrate is formed. A channel sacrificial layer including a material other than polysilicon is formed along a sidewall of the first opening. A second opening extending vertically through a second dielectric deck including a second plurality of interleaved sacrificial layers and dielectric layers on the first dielectric deck is formed to expose the channel sacrificial layer in the first opening. The channel sacrificial layer is removed in the first opening. A memory film and a semiconductor channel are subsequently formed along sidewalls of the first and second openings.

In some embodiments, the material in the channel sacrificial layer includes ceramic. In some embodiments, the material in the channel sacrificial layer includes a dopant into polysilicon.

In some embodiments, prior to forming the channel sacrificial layer, a semiconductor plug is formed at a bottom of the first opening.

In some embodiments, after subsequently forming the memory film and the semiconductor channel, the sacrificial layers in the first and second dielectric decks are replaced with a plurality of conductive layers.

In some embodiments, to subsequently form the memory film and the semiconductor channel, a silicon oxide layer, a silicon nitride layer, a silicon oxide layer, and a polysilicon layer are comprises subsequently deposited along the sidewalls of the first and second openings in this order.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a memory stack comprising interleaved conductive layers and dielectric layers; and
   a channel structure extending vertically through the memory stack and comprising:
     a high dielectric constant (high-k) dielectric layer disposed continuously along a sidewall of the channel structure, wherein the high-k dielectric layer comprises zirconium oxide;
     a memory film over the high-k dielectric layer along the sidewall of the channel structure, the memory film comprising a tunneling layer, a storage layer, and a blocking layer; and
     a semiconductor channel over the memory film along the sidewall of the channel structure,
   wherein each of the conductive layers comprises a gate electrode and an adhesive layer vertically between the gate electrode and at least one of the dielectric layers,
   wherein the adhesive layer is in direct contact with the gate electrode, the high-k dielectric layer, and the at least one of the dielectric layers,
   wherein the memory stack comprises a lower memory deck and an upper memory deck, and the high-k dielectric layer comprises a jagged structure at a boundary area between the lower memory deck and the upper memory deck, and
   wherein the high-k dielectric layer at a bottom of the upper memory deck does not overlap with the high-k dielectric layer at a top of the lower memory deck.

2. The 3D memory device of claim 1, wherein the high-k dielectric layer does not extend between the gate electrode and the at least one of the dielectric layers.

3. The 3D memory device of claim 1, wherein the channel structure comprises a lower channel structure extending vertically through the lower memory deck, and an upper channel structure extending vertically through the upper memory deck.

4. The 3D memory device of claim 1, further comprising:
   a semiconductor plug at a bottom of the channel structure.

5. The 3D memory device of claim 1, wherein the high-k dielectric layer extends along a direction perpendicular to a contacting surface between the adhesive layer and the at least one of the dielectric layers.

6. The 3D memory device of claim 1, wherein the high-k dielectric layer of the upper memory deck and the high-k dielectric layer of the lower memory deck are sequentially formed.

7. The 3D memory device of claim 6, wherein the high-k dielectric layer of the upper memory deck is formed after the high-k dielectric layer of the lower memory deck.

8. A three-dimensional (3D) memory device, comprising:
   a memory stack comprising interleaved conductive layers and dielectric layers; and
   a channel structure extending vertically through the memory stack and comprising:
     a high dielectric constant (high-k) dielectric layer disposed continuously along a sidewall of the channel structure;
     a memory film over the high-k dielectric layer along the sidewall of the channel structure, the memory film comprising a tunneling layer, a storage layer, and a blocking layer; and
     a semiconductor channel over the memory film along the sidewall of the channel structure,
   wherein each of the conductive layers comprises a gate electrode and an adhesive layer vertically between the gate electrode and at least one of the dielectric layers,
   wherein the adhesive layer is in direct contact with the gate electrode, the high-k dielectric layer, and the at least one of the dielectric layers,
   wherein the memory stack comprises a lower memory deck and an upper memory deck, and the high-k dielectric layer comprises a jagged structure at a boundary area between the lower memory deck and the upper memory deck, and
   wherein the high-k dielectric layer at a bottom of the upper memory deck does not overlap with the high-k dielectric layer at a top of the lower memory deck.

9. The 3D memory device of claim 8, wherein the high-k dielectric layer comprises zirconium oxide.

10. The 3D memory device of claim 9, wherein the high-k dielectric layer does not extend between the gate electrode and the at least one of the dielectric layers.

11. The 3D memory device of claim 8, wherein the channel structure comprises a lower channel structure extending vertically through the lower memory deck, and an upper channel structure extending vertically through the upper memory deck.

12. The 3D memory device of claim 8, further comprising:
   a semiconductor plug at a bottom of the channel structure.

13. The 3D memory device of claim 8, wherein the high-k dielectric layer extends along a direction perpendicular to a contacting surface between the adhesive layer and the at least one of the dielectric layers.

14. The 3D memory device of claim 8, wherein the high-k dielectric layer of the upper memory deck and the high-k dielectric layer of the lower memory deck are sequentially formed.

15. The 3D memory device of claim 14, wherein the high-k dielectric layer of the upper memory deck is formed after the high-k dielectric layer of the lower memory deck.

16. A three-dimensional (3D) memory device, comprising:
- a memory stack comprising interleaved conductive layers and dielectric layers; and
- a channel structure extending vertically through the memory stack and comprising:
    - a high dielectric constant (high-k) dielectric layer disposed continuously along a sidewall of the channel structure;
    - a memory film over the high-k dielectric layer along the sidewall of the channel structure, the memory film comprising a tunneling layer, a storage layer, and a blocking layer; and
    - a semiconductor channel over the memory film along the sidewall of the channel structure,
- wherein each of the conductive layers comprises a gate electrode and an adhesive layer vertically between the gate electrode and at least one of the dielectric layers, and the high-k dielectric layer extends along a direction perpendicular to a contacting surface between the adhesive layer and the at least one of the dielectric layers,
- wherein the adhesive layer is in direct contact with the gate electrode, the high-k dielectric layer, and the at least one of the dielectric layers,
- wherein the memory stack comprises a lower memory deck and an upper memory deck, and the high-k dielectric layer comprises a jagged structure at a boundary area between the lower memory deck and the upper memory deck, and
- wherein the high-k dielectric layer at a bottom of the upper memory deck does not overlap with the high-k dielectric layer at a top of the lower memory deck.

17. The 3D memory device of claim 16, wherein the high-k dielectric layer comprises zirconium oxide.

18. The 3D memory device of claim 16, wherein the high-k dielectric layer does not extend between the gate electrode and the at least one of the dielectric layers.

19. The 3D memory device of claim 16, wherein the high-k dielectric layer of the upper memory deck and the high-k dielectric layer of the lower memory deck are sequentially formed.

20. The 3D memory device of claim 19, wherein the high-k dielectric layer of the upper memory deck is formed after the high-k dielectric layer of the lower memory deck.

* * * * *